United States Patent [19]

Filipovic

[11] 4,232,296
[45] Nov. 4, 1980

[54] REMOTE CONTROL/DIGITAL TUNING INTERFACE WITH PARALLEL OPERATION WITH MANUAL SWITCHES

[75] Inventor: Dominik Filipovic, Toronto, Canada

[73] Assignee: U.S. Philips Corporation, New York, N.Y.

[21] Appl. No.: 15,033

[22] Filed: Feb. 26, 1979

Related U.S. Application Data

[63] Continuation of Ser. No. 808,785, Jun. 22, 1977, abandoned.

[30] Foreign Application Priority Data

Jun. 29, 1976 [CA] Canada ................................. 255915

[51] Int. Cl.³ .............................................. H04Q 5/00
[52] U.S. Cl. ............................. 340/167 R; 358/194.1; 340/694
[58] Field of Search ..................... 340/171 PF, 169 R; 343/228; 358/194

[56] References Cited
U.S. PATENT DOCUMENTS

| | | | |
|---|---|---|---|
| 3,028,582 | 4/1962 | Carlson | 343/228 |
| 3,471,833 | 10/1969 | Whitaker | 343/228 |
| 3,588,826 | 6/1971 | Vaccaro | 340/171 PF |
| 3,968,440 | 7/1976 | Ehni | 358/194 |
| 4,005,428 | 1/1977 | Graham | 343/228 |
| 4,041,400 | 8/1977 | Watts | 358/194 |

Primary Examiner—Harold I. Pitts
Attorney, Agent, or Firm—Thomas A. Briody; William J. Streeter; Edward W. Goodman

[57] ABSTRACT

A remote control-digital tuning interfacing system wherein an "on board" receiver at the means to be controlled receives coded transmission from the remote point and demodulates it to produce a digitally coded output which is fed to an "on board" decoder producing the appropriate control voltages to selectively operate electronic switching means. The electronic switching means parallel "on board" push-button operated switches so that a remote control operator can effect, from a remote point, the switching corresponding to that performed at the remote point, thus, only the switching is duplicated and the control complication all resides at the means to be controlled location rendering the system independent of different types of control operation.

3 Claims, 2 Drawing Figures

REMOTE CONTROL/DIGITAL TUNING INTERFACE WITH PARALLEL OPERATION WITH MANUAL SWITCHES

This is a continuation of application Ser. No. 808,785, filed June 22, 1977 abandoned.

BACKGROUND OF THE INVENTION

This invention relates to a remote control system for a television receiver and more particularly to an interfacing system whereby a remote digitally actuated system is interfaced at the televison receiver to operate in parallel with a digital control system incorporated in the receiver. The invention is not concerned with the manner in which the television receiver selects channels and will operate with any system using digital channel selection.

It is known to use digital (push button) random selection of channel with receivers utilizing either frequency synthesis or voltage sensitive capacitor diode channel selection.

As an example of a known system utilizing remote control and voltage sensitive capacitor diode tuning, reference may be made to British Pat. No. 1,368,975—Matsushita Electric Industrial Co. Ltd. sealed Nov. 26, 1971.

In view of the trend to incorporate, in television receivers in particular, tuning systems wherein the operator selects a particular broadcast frequency by push button control whereby a required particular local oscillator frequency is generated in the receiver, either by frequency synthesis or voltage sensitive capacitor control, and mechanically switched tuners are obviated, it becomes feasible and desirable to provide a remote control facility for frequency selection and other functions. Since different methods of selecting frequencies may be used by the same or different manufacturers, it is highly desirable to provide a remote control system which may be readily interfaced with the system used on the receiver regardless of its type.

SUMMARY OF THE INVENTION

It is accordingly the main object of this invention to provide a remote control system, including receiver incorporated "on board" means, which is readily adaptable for use with different digitally operated tuning systems.

It is a further object of this invention to provide a remotely controlled switching system for use in conjunction with a broadcast receiver.

In accordance with the present invention a remote control transmitter is provided with a digital (push-button) control system by means of which the transmitter is energized to transmit coded frequencies, ultra-sonic or radio, which are received at the receiver to be controlled, and which coded frequencies are decoded to provide pulse-code formations which are used to provide control for a switching system, provided in the broadcast receiver, capable of duplicating the switching generally performed at the receiver, and/or providing the necessary switching to accomplish an operation desired by the remote control operator.

Preferably, the remote control system selects so called "channels" by direct digital operation. Thus if channel "10" is desired the operator pushes buttons 1, 0, sequentially at the remote control station and the "on board" receiver interprets the transmission from the remote control transmitter and acts on it to tune the receiver to channel "10" by duplicating the switching necessary at the receiver to select channel "10".

DESCRIPTION OF THE DRAWING

The invention will now be more fully described with reference to the figures of the drawing showing a particular embodiment and in which.

DESCRIPTION OF THE PREFERRED EMBODIMENT

Figure 1:
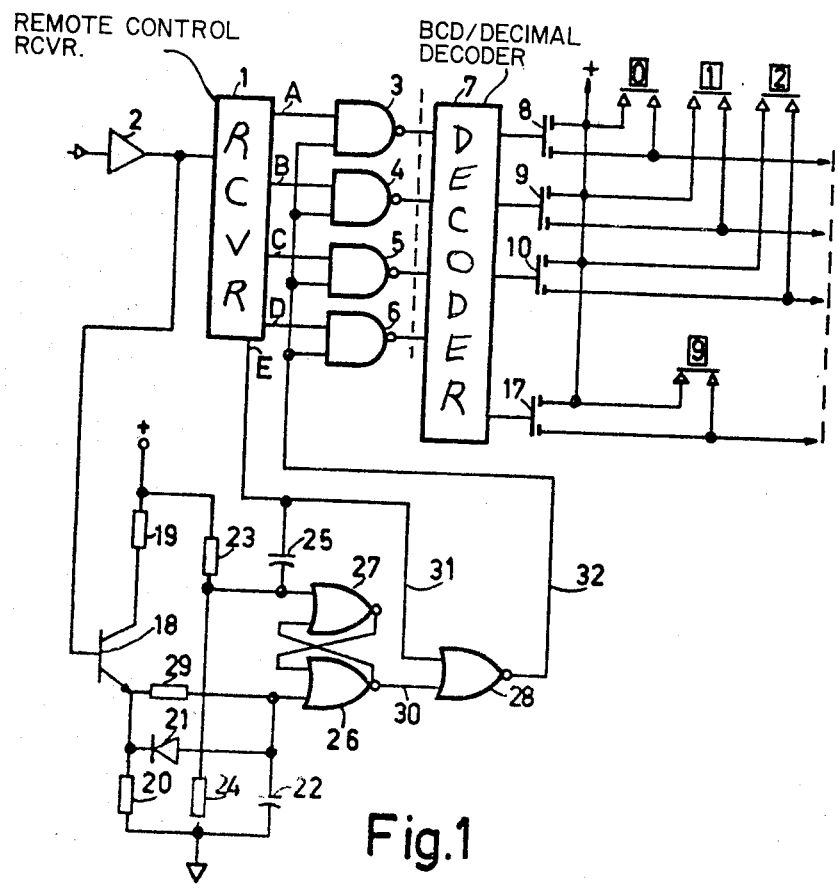
FIG. 1 shows a schematic-block circuit diagram of the "on board" portion of the remote control system and, FIG. 2 shows voltage—time waveform diagrams helpful in explaining the operation of the circuit of FIG. 1.

Referring now to FIG. 1, a remote control receiver 1, is shown having an input amplifier 2, fed by a microphone in the case of ultra-sonic frequency control, which supplies an amplified version of the signal generated at a remote control station (not shown) to the receiver for decoding. The receiver 1 includes four outputs A, B, C, D, each carrying the appropriate "0" or "1" bit information for a four-bit code, and a further output E which supplies an additional "bit" of information, the purpose of which will be referred to later.

The four bit code is supplied, in parallel relationship through NAND gates 3–6 inclusive, to a BCD to Decimal decoder 7 which in turn feeds the coded voltages to a plurality of switches 8–17 inclusive. The switches are shown in the form of field-effect transistors each having the source-drain circuit thereof connected in parallel with the contacts of one of a plurality of mechanical push-button switches digitally labelled 0–9 inclusive, although other types of switches, such as touch sensitive, may be substituted. The switches 8–17 may be incorporated in IC chips.

The additional bit (E) of information provided by receiver 1 is used, when present, to actuate a second switching system which in turn controls the NAND gates 3–6 inclusive, in conjunction with the BCD information, to either open or close such gates. In the present embodiment, for digital channel selection by remote control, gates 3–6 inclusive will be opened, or set to the HIGH output, by the additional switching system when the associated BCD voltage is in the LOW state. When this additional bit is not present, the BCD code may be used to perform other functions, for instance, volume adjustment.

The additional switching system comprises a first transistor 18 to the base electrode of which the input of the remote control receiver 1 is directly connected. The collector electrode of transistor 18 is connected, by means of a resistor 19, to a source of voltage, positive with respect to reference potential. The emitter electrode of transistor 18 is connected both through a resistor 20 to ground and, through the parallel combination of a resistor 29 and diode 21, to one input of NOR gate 26, one of a pair of NOR gates 26, 27, connected in a Flip-Flop bistable or multivibrator arrangement, wherein the output of NOR gate 27 is connected to the second input of NOR gate 26 while the output of NOR gate 26 is connected to one input of NOR gate 27. Said one input of NOR gate 26 is further connected to ground through a capacitor 21.

The output E of the remote control receiver 1 is connected through a capacitor 25 to the other input of NOR gate 27. Resistors 23 and 24 are serially connected between the source of voltage and ground and are connected to said other input of the NOR gate 27 at the junction thereof. Resistors 23 and 24 set the bias potential at the input of NOR gate 27 and additionally act, in conjunction with capacitor 25, as a pulse differentiator.

The output of the NOR gate 26 is connected to one input of a NOR gate 28, the other input of which is connected to output E. NOR gate 28 acts as an inverter to feed a control voltage in parallel to NAND gates 3-6 inclusive.

Figure 2:
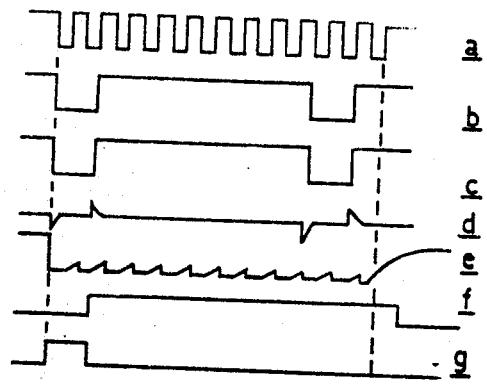

The operation of the circuit will now be explained with reference to FIG. 2 of the drawings.

Waveform a represents the output of a remote control transmitter and, when ultra-sonic frequencies are employed, are normally within the range of 34 to 44 kilo-hertz. The output is a continuous wave so long as a remote control push-button is operated. In the steady state, no signal being received, the outputs A, B, C, D of receiver 1 are arranged to be in the HIGH or "1" state.

The transmitted signal, when received by receiver 1, is decoded, dependent on frequency for instance, into a four bit BCD code and a further control bit herein termed E. Waveform b represents the decoded output of receiver 1, which receiver has built-in timing to produce the coded output in a timed release sequence along with output E shown by waveform c. Dependent on the button pushed at the transmitter the outputs A, B, C, D may be selectively either LOW or HIGH as required for the code employed.

Output E, which is selectively present, is supplied to the differentiating circuit 23, 24, 25 to produce a voltage, the waveform of which is shown by waveform d. The input voltage, waveform a, is supplied to the base electrode of transistor 18 and acts, when negative going, to cut off transistor 18 allowing capacitor 22 to discharge through the diode 21 and the resistor 20 causing a drop in voltage which is supplied to the NOR gates. Capacitor 22 will charge slowly through resistor 29 and discharge rapidly through diode 21 to produce at the input to NOR gate 26 the voltage represented by waveform e. The output of the NOR gates 26, 27, generally in the LOW state, will be set to the HIGH state by the trailing edge of the differentiated E voltage (waveform f). However, in the LOW state output of the Flip-Flop and in the presence of voltage E, supplied also to gate 28, the output of gate 28 on line 32 will be in the HIGH or "1" state (waveform g) and any of gates 3-6 inclusive, receiving a LOW signal from receiver 1 will be set to the high output state to feed the appropriate code to decoder 7, the combinations of codes appearing at the outputs of gates 3-6 determining the output of decoder 7. The setting of the output of the Flip-Flop to "High" by the trailing edge pulse of the differentiated voltage pulse E blocks the gates 3-6 inclusive and as a consequence the BCD code is provided once only during each transmission from the remote control transmitter.

The outputs from the BCD—Decimal decoder 7 switch on the appropriate F.E.T. device, switches 8-17, to provide switching of the digital control circuits, not shown, to correspond with the switching action taking place at the remote control transmitter. A digital-type indicator may also be controlled by decoder 7.

It will be apparent that all the functions of the switches, paralleled by the remote control system according to this invention, can be effected from the remote control station.

Although a specific embodiment of the invention has been used in the explanation, it will be obvious that, in view of the present state of the art, other equivalent means, such as NOR gates, inverters, etc., may be used without departing from the spirit and scope of this invention as set forth in the appended claims. It will be readily apparent that the code E may be employed to direct the outputs A, B, C, D to further switching circuits, not shown for reasons of simplicity, which switching circuits control, for instance, motor operated volume, contrast potentiometer etc. Additionally the coded information can be expanded or contrasted to facilitate greater or fewer remotely controlled functions at the broadcast receiver or other device.

What is claimed is:

1. A system for interfacing a remote control unit with a receiver having a plurality of switches, said system comprising a remote control receiver having input means for receiving a signal encoded with a plurality of function control bits and an extra bit, a plurality of outputs for supplying said function control bits respectively, and an output for supplying said extra bit; a plurality of gates having first inputs coupled respectively to said plurality of outputs of said remote control receiver, second inputs, and outputs; a decoder having inputs coupled to said gate outputs respectively, and a plurality of outputs; a plurality of electronic switches having control inputs coupled to said decoder outputs respectively, and conduction electrodes adapted to be coupled in parallel to said receiver switches; and means coupled between said extra bit output means and said second inputs of said gates for ensuring that said function control bits are supplied to said decoder inputs only during the duration of said extra bit.

2. An interface system as claimed in claim 1, wherein said ensuring means comprises a differentiator circuit coupled to said extra bit output of said remote control receiver, a bistable circuit coupled to said differentiator circuit, and a NOR gate coupled between said bistable circuit and said second inputs of said gates.

3. An interfacing system as claimed in claim 1, wherein said received signal is in BCD form, and said decoder comprises a BCD to decimal converter.

* * * * *